US00RE48695E

(19) United States
(12) Reissued Patent
Zhang et al.

(10) Patent Number: US RE48,695 E
(45) Date of Reissued Patent: Aug. 17, 2021

(54) TRANSPARENT OLED DEVICE AND DISPLAY DEVICE EMPLOYING SAME

(71) Applicants: BEIJING VISIONOX TECHNOLOGY CO., LTD., Beijing (CN); TSINGHUA UNIVERSITY, Beijing (CN)

(72) Inventors: Guohui Zhang, Beijing (CN); Mengzhen Li, Beijing (CN); Man Li, Beijing (CN); Lian Duan, Beijing (CN)

(73) Assignees: BEIJING VISIONOX TECHNOLOGY CO., LTD., Beijing (CN); TSINGHUA UNIVERSITY, Beijing (CN)

(21) Appl. No.: 16/412,454

(22) Filed: May 15, 2019

Related U.S. Patent Documents

Reissue of:
(64) Patent No.: 9,692,006
Issued: Jun. 27, 2017
Appl. No.: 15/109,410
Filed: Jun. 30, 2016

U.S. Applications:
(63) Continuation of application No. 15/109,410, filed on Jun. 30, 2016, now Pat. No. 9,692,006.

(30) Foreign Application Priority Data

Dec. 31, 2013 (CN) ..... 201310749017.2

(51) Int. Cl.
*H01L 51/52* (2006.01)
*H01L 27/32* (2006.01)

(52) U.S. Cl.
CPC ..... *H01L 27/3276* (2013.01); *H01L 51/5218* (2013.01); *H01L 27/326* (2013.01); (Continued)

(58) Field of Classification Search
CPC ..... H01L 51/5218; H01L 27/3276; H01L 51/5206
See application file for complete search history.

(56) References Cited

U.S. PATENT DOCUMENTS 8,461,592 B2 6/2013 Ha et al.
2003/0156239 A1* 8/2003 Inoue ..... G02F 1/133553 349/113

(Continued)

FOREIGN PATENT DOCUMENTS

CN 1307442 A 8/2001
CN 1816228 A 8/2006

(Continued)

*Primary Examiner* — Tuan H Nguyen
(74) *Attorney, Agent, or Firm* — Bayramoglu Law Offices LLC

(57) ABSTRACT

The present invention discloses a transparent OLED device, which comprises a plurality of pixels, each pixel comprising an organic functional layer, a first transparent electrode and a second transparent electrode being disposed on both sides of the organic functional layer, a reflective electrode being disposed on one side of the organic functional layer, the area of the reflective electrode being less than that of the organic functional layer. With regard to the transparent OLED device, by providing a reflective electrode, a combination of a light-emitting device over a microdomain is combined with a transparent light-emitting device, such that the luminance on both sides of a transparent OLED device can be respectively adjusted to be the same or different as required. The present invention can be applied to the field of transparent illumination or display.

14 Claims, 2 Drawing Sheets

(52) U.S. Cl.
CPC ..... *H01L 51/5206* (2013.01); *H01L 51/5234* (2013.01); *H01L 51/5253* (2013.01); *H01L 2251/5323* (2013.01)

(56) References Cited

U.S. PATENT DOCUMENTS

| | | | | |
|---|---|---|---|---|
| 2003/0156240 | A1* | 8/2003 | Oda | G02F 1/133553 349/113 |
| 2003/0201716 | A1 | 10/2003 | Yamazaki et al. | |
| 2005/0173693 | A1* | 8/2005 | Uchida | H01L 27/3211 257/13 |
| 2005/0230684 | A1* | 10/2005 | Seo | H01L 27/3248 257/72 |
| 2006/0097251 | A1* | 5/2006 | Kang | H01L 51/5271 257/40 |
| 2006/0138945 | A1* | 6/2006 | Wolk | H01L 27/3211 313/506 |
| 2007/0228399 | A1* | 10/2007 | Iwawaki | H01L 51/006 257/89 |
| 2008/0258609 | A1* | 10/2008 | Nakamura | H01L 51/5265 313/504 |
| 2009/0072709 | A1* | 3/2009 | Kobayashi | H01L 27/3206 313/503 |
| 2010/0090592 | A1* | 4/2010 | Shiobara | H01L 27/3211 313/504 |
| 2010/0237374 | A1* | 9/2010 | Chu | H01L 51/5271 257/98 |
| 2011/0240964 | A1 | 10/2011 | Ko et al. | |
| 2011/0272675 | A1 | 11/2011 | Chung et al. | |
| 2012/0074435 | A1 | 3/2012 | Ha et al. | |
| 2015/0102306 | A1 | 4/2015 | Shi et al. | |
| 2015/0102309 | A1 | 4/2015 | Tsuzaki | |
| 2015/0171375 | A1* | 6/2015 | Setz | H01L 51/5275 257/40 |
| 2016/0079286 | A1* | 3/2016 | Jin | H01L 29/66742 257/71 |
| 2016/0155977 | A1* | 6/2016 | Kim | H01L 51/5016 257/40 |
| 2016/0372712 | A1* | 12/2016 | Liao | H01L 51/5271 |
| 2017/0062767 | A1* | 3/2017 | Bao | H01L 51/5056 |

FOREIGN PATENT DOCUMENTS

| | | | |
|---|---|---|---|
| CN | 101169910 | A | 4/2008 |
| CN | 101373576 | A | 2/2009 |
| CN | 102881695 | A | 1/2013 |
| CN | 103345884 | A | 10/2013 |
| CN | 103474448 | A | 12/2013 |
| CN | 103715230 | A | 4/2014 |
| CN | 103715369 | A | 4/2014 |
| JP | 2006-140127 | A | 6/2006 |
| JP | 2006-140151 | A | 6/2006 |
| JP | 2011-228249 | A | 11/2011 |
| JP | 2012-033307 | A | 2/2012 |
| JP | 2012506604 | A | 3/2012 |
| JP | 2012-142582 | A | 7/2012 |
| JP | 2012-155320 | A | 8/2012 |
| JP | 2012-226365 | A | 11/2012 |
| JP | 2013-117719 | A | 6/2013 |
| KR | 1020060042779 | A | 5/2006 |
| KR | 10-2010-0105431 | A | 9/2010 |
| KR | 1020110046564 | A | 5/2011 |
| TW | 201246552 | A | 11/2012 |
| WO | 2013190781 | A1 | 12/2013 |

* cited by examiner

TRANSPARENT OLED DEVICE AND DISPLAY DEVICE EMPLOYING SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE TO RELATED APPLICATIONS*

*This application is a re-issue of U.S. patent application Ser. No. 15/109,410, filed on Jun. 30, 2016, now U.S. Pat. No. 9,692,006 issued on Jun. 27, 2017, where U.S. patent application Ser. No. 15/109,410 is an application of National Stage Entry of PCT/CN2014/095335, filed on Dec. 29, 2014, and claims priority to Chinese Foreign Priority Document CN 201310749017 filed on Dec. 31, 2013.*

TECHNICAL FIELD

The present invention relates to an organic light-emitting diode (OLED) device and in particular to a transparent OLED device and a display device using the transparent OLED device.

BACKGROUND

OLED devices are active light-emitting devices. Compared with thin-film transistor LCDs (TFT-LCDs) in the existing mainstream flat panel display technology, OLEDs, due to their advantages such as high contrast, wide angle of view, low power consumption, thinner size and the like, are expected to become the flat panel display technology of the next generation, and are one of technologies that are highly concerned among the existing flat panel display technologies.

Due to the active light-emitting property of OLEDs, backlight is not required such that transparent display can be achieved. A transparent OLED display, with advantages of self-illumination and penetration of ambient light through the display screen, becomes a novel display technology in the future. However, in an existing transparent OLED device, both the anode and the cathode of the OLED device are prepared by using a transparent conductive layer. This results in the following defects:

1) inconsistent luminance of two light-emitting surfaces; and 2) incapable of individually adjusting the luminance of the two light-emitting surfaces.

SUMMARY

Technical Problems

Technical problems to be solved by the present invention are to provide a transparent OLED device that can individually adjust light-emitting of two light-emitting surfaces and make the luminance of the two light-emitting surfaces consistent, and a display device that employs the transparent OLED device.

Solution to the Problems

To solve the aforementioned problems, the present invention provides a transparent OLED device including a plurality of pixels, each pixel including an organic functional layer, a first transparent electrode and a second transparent electrode being disposed on both sides of the organic functional layer respectively, a reflective electrode being disposed on one side of the organic functional layer, the area of the reflective electrode being less than that of the organic functional layer.

Further, the reflective electrode is located between the first transparent electrode and the organic functional layer, and an insulating layer is disposed between the reflective electrode and the first transparent electrode.

Further, the area of the reflective electrode is 10% to 50% of the area of the organic functional layer.

Further, reflective electrodes between adjacent pixels in one direction are electrically connected, and the reflective electrodes are led out from pixels located at both ends and connected to a power supply.

Further, the reflective electrode is located on the same side as the first transparent electrode, and is disposed in parallel to the first transparent electrode; and a slit is formed between the reflective electrode and the first transparent electrode. Further, insulating material is filled in the slit.

Further, the second transparent electrode is divided into two portions, with one portion being disposed opposite to the reflective electrode and the other portion being disposed opposite to the first transparent electrode.

Further, the first transparent electrode is an anode, and the second transparent electrode is a cathode; or the first transparent electrode is a cathode, and second transparent electrode is an anode.

Further, the average light transmittance the first transparent electrode at a visible wavelength is 50% to 95%; and the average light transmittance of the second transparent electrode at a visible wavelength is 5% to 95%.

The present invention also provides an organic light-emitting display device including the aforementioned transparent OLED device.

The present invention achieves the following beneficial effects:

With regard to the transparent OLED device, by providing a reflective electrode, a light-emitting device over a microdomain is combined with a transparent light-emitting device, such that the luminance on both sides of a transparent OLED device can be respectively adjusted to be the same or different as required. The present invention can be applied to the field of transparent illumination or display.

DETAILED DESCRIPTION

In order to make those skilled in the art better understand and practice the present invention, the present invention will be further described hereinafter in detail with reference to the accompanying drawings and specific embodiments, but the embodiments exemplified hereinafter are not intended to limit the present invention.

Figure 1:
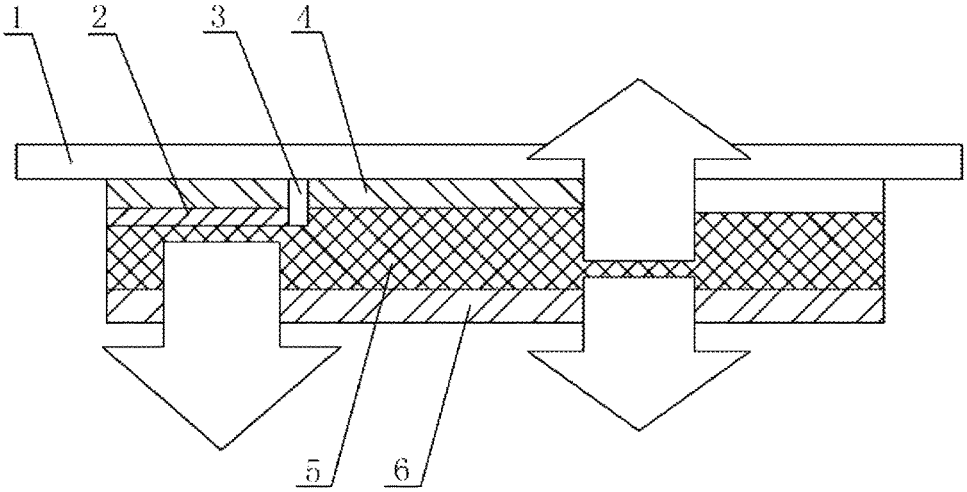
FIG. 1 is a schematic structural view of a transparent OLED device according to one embodiment of the present invention.

As shown in FIG. 1, in this embodiment, a transparent OLED device includes a plurality of pixels. The size of each pixel is not limited. However, generally, the size of a pixel should be less than the minimum resolution of human eyes having a corresponding distance from the screen. Each pixel includes an organic functional layer 5. The organic functional layer 5, which is the same as an organic functional layer in the existing technique, includes a hole injection layer, an organic light-emitting layer, an electron injection layer and the like, and will not be described repeatedly here. A first transparent electrode 4 and a second transparent electrode 6 are disposed on both sides of the organic functional layer 5 respectively, wherein a substrate 1 is on the outer side of the first transparent electrode 4. A reflective electrode 2 is disposed on one side of the organic functional layer 5, and the area of the reflective electrode 2 is less than that of the organic functional layer 5. In this embodiment, the reflective electrode 2 is located between the first transparent electrode 4 and the organic functional layer 5, and an insulating layer 3 is disposed between the reflective electrode 2 and the first transparent electrode 4 in order to prevent a short circuit between the two.

When the transparent OLED device of the present invention is in use, by powering on the reflective electrode 2 and the second transparent electrode 6, the transparent OLED device may be controlled to emit light towards the second transparent electrode 6; and by powering on the first transparent electrode 4 and the second transparent electrode 6, the double-sided light-emitting or display of the transparent OLED device may be achieved. In addition, if the reflective electrode 2, the first transparent electrode 4 and the second transparent electrode 6 are powered on simultaneously, but are subjected to a different current or voltage, it is possible to adjust the double-sided light-emitting luminance. In addition, by setting the color of an organic functional layer corresponding to the reflective electrode 2 in a different color from that of an organic functional layer corresponding to the first transparent electrode 4, the display color may be adjusted by the reflective electrode 2.

In the present invention, the area of the reflective electrode is preferably 10% to 50% of the area of the organic functional layer. The effect of adjustment will not be significant when the area of the reflective electrode is too small, while the transparency of the OLED device will be influenced when the area of the reflective electrode is too large.

Manufacture of the transparent OLED device of this embodiment includes the following steps:

preparing a first transparent electrode 4 on a transparent substrate 1;

preparing a reflective electrode layer on the first transparent electrode 4;

etching a portion of the reflective electrode layer by processes such as coating, exposing, developing and etching, with the remaining portion forming a reflective electrode 2;

etching an edge of the reflective electrode 2, such that a portion of the reflective electrode 2 connected to the first transparent electrode 4 is disconnected;

filling the part where the reflective electrode 2 is disconnected from the first transparent electrode 4 with an insulating material to form an insulating layer 3;

evaporating an organic functional layer 5 over the first transparent electrode 4 and the reflective electrode 2; and preparing a second transparent electrode 6 over the organic functional layer 5 to obtain a transparent OLED device of this embodiment.

Nevertheless, what is described above is only a preferred scheme for manufacturing a transparent OLED device of this embodiment, and the actual manufacturing process is not limited thereto.

Figure 2:
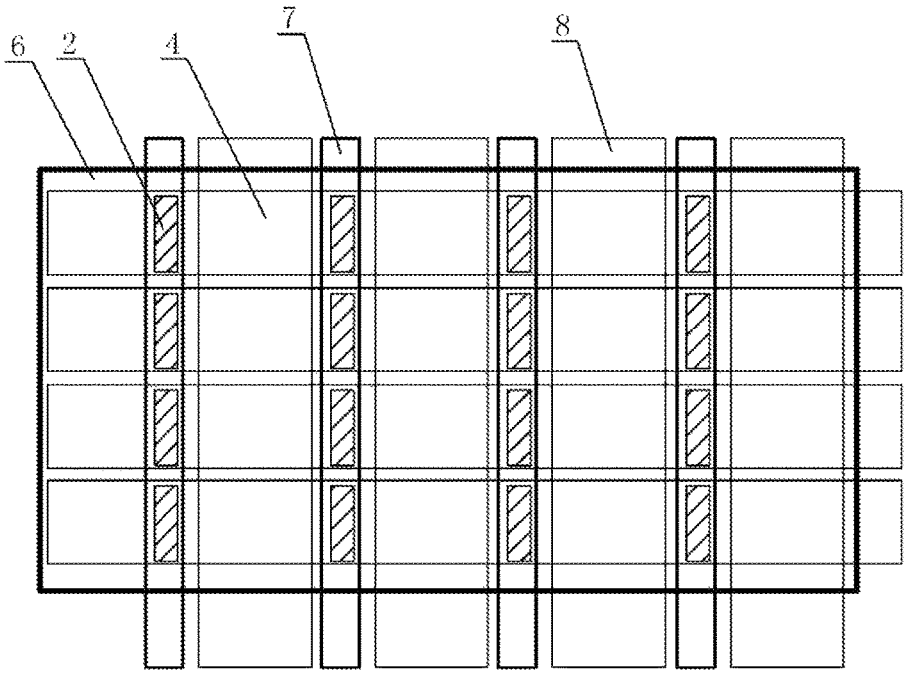
FIG. 2 is a schematic planar structural view illustrating connection of a plurality of pixels according to the present invention.

In this embodiment, since the reflective electrode 2 is disposed between the first transparent electrode 4 and the second transparent electrode 6, to connect the reflective electrode 2 of each pixel to the power supply, the reflective electrodes 2 between adjacent pixels in one direction may be electrically connected, and the serially-connected reflective electrodes 2 are led out from pixels at both ends and connected to the power supply. As in the embodiment shown in FIG. 2, in this embodiment, the reflective electrodes 2 between pixels of each row in the longitudinal direction, i.e., in a same row, are connected in series, and are led out from pixels at both extreme ends to form a reflective lead-out electrode 7, and the reflective lead-out electrode 7 is connected to an external power supply to supply power to the reflective electrode 2. Since the area of the first transparent electrode 4 in this embodiment completely covers the organic functional layer 5 of a pixel, the first transparent electrodes 4 between pixels in a same row may be connected in series and then led out from both ends to form a first transparent lead-out electrode 8 in the same manner as the reflective electrode; or, the first transparent electrodes 4 of all pixels may be electrically connected and then led out from the surrounding.

Figure 3:
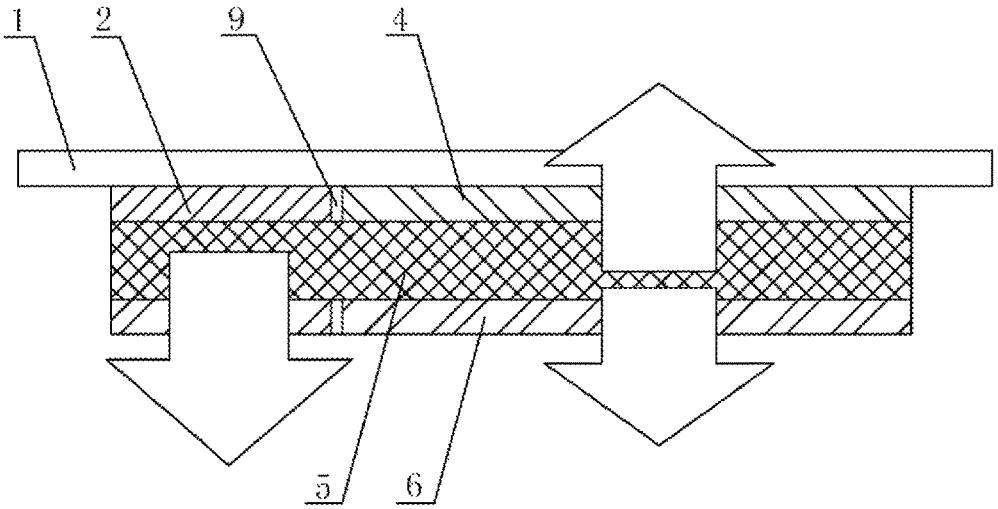
FIG. 3 is a schematic structural view of a transparent OLED device according to another embodiment of the present invention.

As in another embodiment of the transparent OLED device of the present invention shown in FIG. 3, in this embodiment, the reflective electrode 2 is located on a same side as the first transparent electrode 4, and is disposed in parallel to the first transparent electrode 4. To prevent a short circuit between the reflective electrode 2 and the first transparent electrode 4, a slit 9 may be formed between the reflective electrode 2 and the first transparent electrode 4. Further preferably, an insulating material may be filled in the slit 9 to enhance the insulating property. However, the second transparent electrode 6 in this embodiment is divided into two portions, with one portion being disposed opposite to the reflective electrode 2 and the other portion being disposed opposite to the first transparent electrode 4. To achieve the insulating effect, a slit is also formed between the two portions of the second transparent electrode 6. Furthermore, insulating material may be also filled in the slit. Of course, in other embodiments, the second transparent electrode 6 may be an entirety which completely covers the organic functional layer 5.

In the above-mentioned embodiments, the first transparent electrode 4 and the second transparent electrode 6 are a cathode and an anode of an OLED device respectively, and may be exchangeable in position. That is, the first transparent electrode 4 may be an anode and the second transparent electrode 6 may be a cathode; or, the first transparent electrode 4 may be a cathode and the second transparent electrode 6 may be an anode, without imposing any influence on the implementation of the present invention. The average light transmittance of the first transparent electrode 4 at a visible wavelength is 5% to 95%; and the average light transmittance of the second transparent electrode at a visible wavelength is 5% to 95%. When the average light transmittance of the second transparent electrode 6 at a visible wavelength is 5% to 50%, a large portion of light emitted by the OLED device is output from the side of the first transparent electrode 4, and a small portion thereof is output from the side of the second transparent electrode 6, thereby forming a double-sided display. Light emitted by the OLED device may be output from both sides, thereby forming a transparent OLED device.

The aforementioned embodiments are only preferred embodiments merely used for describing the present invention in detail, and the protection scope of the present invention is not limited thereto. For a person skilled in the art, various replacements or improvements may be made on the basis of the present invention, and those replacements or improvements shall be regarded as falling into the protection scope of the present invention. The protection scope of the present invention is subject to the appended claims.

What is claimed is:

1. A transparent OLED device, comprising:

a plurality of pixels, each pixel including:

an organic functional layer *having two sides*, a first transparent electrode, and a second transparent electrode [being] disposed on [both] *the two* sides of the organic functional layer respectively, *and*

[wherein] a reflective electrode [is] disposed on one [side] *of the sides* of the organic functional layer, [and] the area of the reflective electrode [is] *being* less than that of the organic functional layer*, and*

*wherein*

*the reflective electrode is located between the first transparent electrode and the organic functional layer, and an insulating layer is disposed between the reflective electrode and the first transparent electrode, or*

*the reflective electrode is located on a same side as the first transparent electrode, and is disposed in parallel to the first transparent electrode; and a slit is formed between the reflective electrode and the first transparent electrode*.

[2. The transparent OLED device according to claim 1, wherein the reflective electrode is located between the first transparent electrode and the organic functional layer, and an insulting layer is disposed between the reflective electrode and the first transparent electrode.]

3. The transparent OLED device according to claim 1, wherein the area of the reflective electrode is 10% to 50% of the area of the organic functional layer.

4. The transparent OLED device according to claim 1, wherein reflective electrodes between adjacent pixels in one direction are electrically connected, and the reflective electrodes are led out from pixels located at both ends and connected to a power supply.

[5. The transparent OLED device according to claim 1, wherein the reflective electrode is located on a same side as the first transparent electrode, and is disposed in parallel to the first transparent electrode; and a slit is formed between the reflective electrode and the first transparent electrode.]

6. The transparent OLED device according to claim [5] *1*, wherein the slit is filled with an insulating material.

7. The transparent OLED device according to claim [5] *1*, wherein the second transparent electrode is divided into two portions, with one portion being disposed opposite to the reflective electrode and the other portion being disposed opposite to the first transparent electrode.

8. The transparent OLED device according to claim 1, wherein the first transparent electrode is an anode, and the second transparent electrode is a cathode; or the first transparent electrode is a cathode, and the second transparent electrode is an anode.

9. The transparent OLED device according to claim 1, wherein:

the average light transmittance of the first transparent electrode at a visible wavelength is 50% to 95%; and the average light transmittance of the second transparent electrode at a visible wavelength is 5% to 95%.

10. An organic light emitting display device comprising a transparent OLED device according to claim 1.

[11. The transparent OLED device according to claim 2, wherein reflective electrodes between adjacent pixels in one direction are electrically connected, and the reflective electrodes are led out from pixels located at both ends and connected to a power supply.]

[12. An organic light emitting display device comprising a transparent OLED device according to claim 2.]

13. An organic light emitting display device comprising a transparent OLED device according to claim 3.

14. An organic light emitting display device comprising a transparent OLED device according to claim 4.

[15. An organic light emitting display device comprising a transparent OLED device according to claim 5.]

16. An organic light emitting display device comprising a transparent OLED device according to claim 6.

17. An organic light emitting display device comprising a transparent OLED device according to claim 7.

18. An organic light emitting display device comprising a transparent OLED device according to claim 8.

19. An organic light emitting display device comprising a transparent OLED device according to claim 9.

[20. An organic light emitting display device comprising a transparent OLED device according to claim 11.]

* * * * *